United States Patent
Lin et al.

(10) Patent No.: US 9,472,778 B2
(45) Date of Patent: Oct. 18, 2016

(54) DISPLAY APPARATUS AND THE SEALING METHOD THEREOF

(71) Applicant: INNOLUX CORPORATION, Miaoli County (TW)

(72) Inventors: Tun-Huang Lin, Miaoli County (TW); Hao-Jung Huang, Miaoli County (TW); Hao-Yu Chou, Miaoli County (TW); Chi-Hsin Lee, Miaoli County (TW)

(73) Assignee: INNOLUX CORPORATION, Miaoli County (TW)

( * ) Notice: Subject to any disclaimer, the term of this patent is extended or adjusted under 35 U.S.C. 154(b) by 0 days.

(21) Appl. No.: 14/855,586

(22) Filed: Sep. 16, 2015

(65) Prior Publication Data

US 2016/0005996 A1    Jan. 7, 2016

Related U.S. Application Data

(62) Division of application No. 14/102,872, filed on Dec. 11, 2013, now abandoned.

(30) Foreign Application Priority Data

Jan. 18, 2013    (TW) .............................. 102101972 A

(51) Int. Cl.
*H01L 23/10* (2006.01)
*H01L 51/52* (2006.01)
*H01L 51/56* (2006.01)

(52) U.S. Cl.
CPC ........... *H01L 51/5246* (2013.01); *H01L 51/56* (2013.01)

(58) Field of Classification Search
CPC .......................... H01L 51/5246; H01L 51/56
USPC ............................................................ 445/25
See application file for complete search history.

(56) References Cited

U.S. PATENT DOCUMENTS

| | | | |
|---|---|---|---|
| 5,489,321 A * | 2/1996 | Tracy | C03B 23/245 156/272.2 |
| 6,373,025 B1 | 4/2002 | Takeuchi et al. | |
| 7,371,143 B2 | 5/2008 | Becken et al. | |
| 2004/0207314 A1* | 10/2004 | Aitken | C03C 3/072 313/504 |
| 2007/0128965 A1* | 6/2007 | Burt | H01L 51/5246 445/25 |
| 2007/0199925 A1* | 8/2007 | Kigawa | H01L 21/50 219/121.64 |
| 2008/0171485 A1 | 7/2008 | Choi et al. | |
| 2010/0304513 A1* | 12/2010 | Nguyen | H01L 51/448 438/27 |
| 2011/0165816 A1 | 7/2011 | Lee et al. | |
| 2012/0318023 A1* | 12/2012 | Shimomura | C03C 27/06 65/43 |
| 2013/0101754 A1 | 4/2013 | Shimomura et al. | |

* cited by examiner

*Primary Examiner* — Nimeshkumar Patel
*Assistant Examiner* — Christopher Raabe
(74) *Attorney, Agent, or Firm* — WPAT, PC; Justin King

(57) ABSTRACT

This disclosure provides a display apparatus and the sealing method thereof. The display apparatus includes: a substrate having a displaying region and a non-displaying region surrounding the displaying region; and a frit disposed on the non-displaying region to form a closed loop which surrounds the displaying region and has both a start portion and an end portion not overlapping each other; wherein a first light beam is applied to the frit to sinter it along the loop in a first direction, and a second light beam is applied to the frit to sinter it along the loop in a second direction, starting at the start portion and ending up at the end portion; wherein, the second direction is different from the first direction.

6 Claims, 4 Drawing Sheets

DISPLAY APPARATUS AND THE SEALING METHOD THEREOF

This application claims the benefit of Taiwan application Serial No. 102101972, filed Jan. 18, 2013, the disclosure of which is incorporated by reference herein in its entirety.

TECHNICAL FIELD

The present disclosure relates to the field of frit glazing for sealing a display apparatus, and more particularly, to a method for frit-sealing an organic light-emitting diode (OLED) device in which a heating source is used to glaze frit in the sealing process of display apparatus.

TECHNICAL BACKGROUND

OLEDs have been developed for display applications due to their advantages like improved brightness, better power efficiency, faster response time, and coloring performance. However, the OLED devices are subject to diffusion of environmental moisture and oxygen, which may damage the organic materials and oxidize the conductive electrodes therein. This can lead to degraded performance and reduced lifetime of the OLED devices. Therefore, improved sealing processes are very important for their practical manufacturing, so as to protect the OLED devices from being penetrated by the environmental moisture and oxygen.

Recently, the frit sealing technique has been used to the OLED packaging, and it is proved to have effective prevention of moisture and oxygen. A display may include a cover plate or a base plate, which has a displaying region and a non-displaying region surrounding the displaying region. A frit can be dispensed on the non-displaying region and then baked in an oven at about 470, so that it can be glazed. The glazed frit is then emitted by a laser beam to be sintered, so that it can join the cover plate and the base plate tightly. The laser emission facilitates precise control of the frit curing. In the frit-sealing process, the frit glazing is performed before the frit sintering, so it can be recited as "pre-sintering", also.

As described above, the high-temperature condition is used in the frit glazing, so it would be not applicable to flexible plastic substrates, such as a cover plate with a color filter in the white-light OLED device. Although the laser heating can also be used to replace the high-temperature baking in the pre-sintering process, a curve breach 10 is often formed at start or end locations of the laser emission, as shown in FIG. 1, leading to the failure in the subsequent laser sealing process of the device. Consequently, it is in need to develop a new frit pre-sintering method for the organic electronic or opto-electronic devices.

TECHNICAL SUMMARY

According to one aspect of the present disclosure, one embodiment provides a display apparatus comprising: a substrate having a displaying region and a non-displaying region surrounding the displaying region; and a frit disposed on the non-displaying region to form a closed loop which surrounds the displaying region and has both a start portion and an end portion not overlapping each other; wherein a first light beam is applied to the frit to sinter it along the closed loop in a first direction, and a second light beam is applied to the frit to sinter it along the closed loop in a second direction, starting at the start portion and ending up at the end portion; wherein, the second direction is different from the first direction.

In the embodiment, the first and second light beams may be produced by a glazing module which comprises: a heating source, including a laser or a halogen lamp, generating a first light beam and a second light beam; and a converging unit configured for focusing the first and second light beams on the frit to form a first light spot and a second light spot, respectively; wherein each of the first and second light spots has a diameter larger than or equal to a width of the closed loop.

In the embodiment, the diameter of each of the first and second light spots is equal to the width of the closed loop. The first and second light spots overlap at either the start portion or the end portion of the closed loop in an overlapping area not less than 50% of the start portion or the end portion.

According to another aspect of the present disclosure, another embodiment provides a method for sealing a display apparatus comprising: providing a substrate which has a displaying region and a non-displaying region surrounding the displaying region; disposing a frit to form a closed loop on the non-displaying region, in which the closed loop surrounds the displaying region and has both a start portion and an end portion not overlapping each other; providing a heating source configured for generating a first light beam and a second light beam; providing a converging unit configured for focusing the first and second light beams on the substrate to form the first and second light spots, respectively; applying the first and second light beams at the start portion to glaze the frit at the start portion; moving the first and second light beams along the closed loop in a first direction and a second direction, respectively, starting at the start portion and ending up at the end portion, in which the second direction is different from the first direction; and applying the first and second light beams at the end portion of the closed loop; wherein each of the first and second light spots has a diameter larger than or equal to a width of the closed loop.

In the embodiment, the heating source comprises a laser or a halogen lamp.

In the embodiment, the diameter of each of the first and second light beams is equal to the width of the closed loop. The first and second light beams overlap at either the start portion or the end portion of the closed loop in an overlapping area not less than 50% of the start portion or the end portion.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For further understanding and recognizing the fulfilled functions and structural characteristics of the disclosure, several exemplary embodiments cooperating with detailed description are presented as the following. Reference will now be made in detail to the preferred embodiments, examples of which are illustrated in the accompanying drawings.

In the following description of the embodiments, it is to be understood that when an element such as a layer (film), region, pattern, or structure is stated as being "on" or "under" another element, it can be "directly" on or under another element or can be "indirectly" formed such that an intervening element is also present. Also, the terms such as "on" or "under" should be understood on the basis of the drawings, and they may be used herein to represent the relationship of one element to another element as illustrated in the figures. It will be understood that this expression is intended to encompass different orientations of the elements in addition to the orientation depicted in the figures, namely, to encompass both "on" and "under". In addition, although the terms "first", "second" and "third" are used to describe various elements, these elements should not be limited by the term. Also, unless otherwise defined, all terms are intended to have the same meaning as commonly understood by one of ordinary skill in the art.

Both moisture and oxygen have a great effect upon the electronic or opto-electronic devices including organic materials. The environmental moisture and oxygen may damage the organic materials and deteriorate the device performance. Therefore, improved sealing processes are especially important for practical manufacturing, so as to protect such organic devices from being penetrated by the environmental moisture and oxygen. Recently the frit sealing has been developed in sealing OLED devices, in which the frit is sintered by laser emission.

Figure 1:
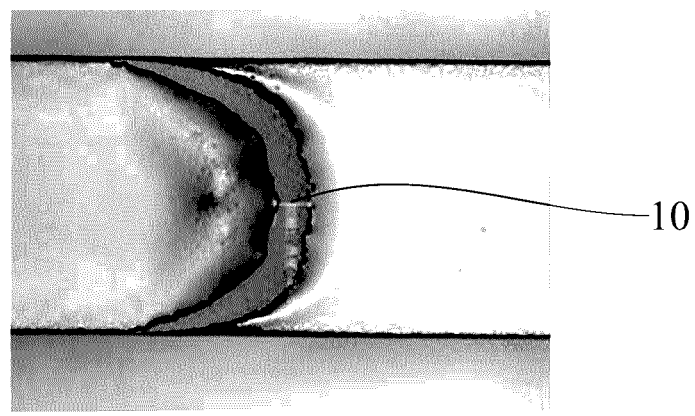
FIG. 1 is a picture of a curve breach formed in the frit glazed by single laser beam emission.

As to the existing frit sealing techniques, the frit is pre-sintered by single laser beam emission and a curve breach 10 is often formed at start or end location of the emission, as shown in FIG. 1. The laser beam used in the pre-sintering usually has a circle cross-section. In case that it moves left along a pre-determined path to glaze the frit, starting at the start emission location, the right part of the circle at the start emission location may be less emitted, as compared with the left part. Every part of the frit in the circle may absorb varied or non-uniform laser energy, and the optical energy accumulated in the right arc of the circle may be incapable of glazing the frit therein. This may induce heat stress and plastic deformation due to the thermal expansion behaviors of the frit in the left part of the circle at the start emission location. Thus, a curve breach 10 or a peeling phenomenon may appear at the interface between the glazed and un-glazed frit.

Figure 2:
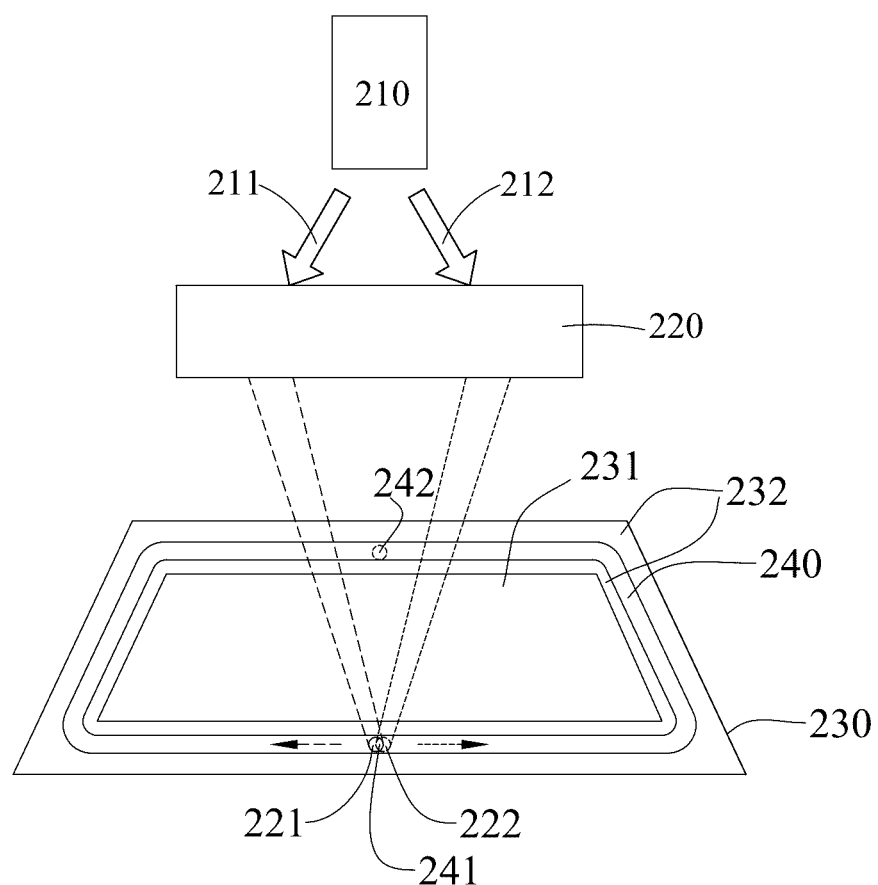
FIG. 2 shows a schematic diagram of a display apparatus to be frit sealed by a glazing module according to one embodiment of the present disclosure (at the start).

In the following embodiments, OLED displays will be used to explain the innovative techniques in this disclosure. It should be understood that it is not limited thereto, and it can be applied to the other organic electronic or opto-electronic devices. FIG. 2 shows a schematic diagram of a display apparatus to be frit sealed by a glazing module 200 according to one embodiment of the present disclosure. The embodiment can be applied to a substrate 230, which has a displaying region 231 and a non-displaying region 232 surrounding the displaying region 231. A frit can be disposed on the non-displaying region 232 to form a closed loop 240, which surrounds the displaying region 231 and has both a start portion 241 and an end portion 242. The start portion 241 and the end portion 242 are separated from each other. As shown in FIG. 2, the glazing module includes a heating source 210 and a converging unit 220. The heating source 210 can generate a first light beam 211 and a second light beam 212, each of which has a uniform distribution of intensity on its cross-section. The converging unit 220 is configured for focusing the first light beam 211 and the second light beam 212 on the substrate 230 to form a first light spot 221 and a second light spot 222, respectively. Each of the first and second light spots 221 and 222 has a diameter larger than or equal to a line-width of the closed loop 240, so that all the frit in the closed loop 240 can be emitted to receive the optical energy from the heating source 210.

The heating source 210 can be a heater which provides thermal energy according to optical energy. For example, the heating source 210 can be a laser emitting a laser beam or a halogen lamp generating a halogen light beam, but this disclosure is not limited thereto. In the embodiment, a laser with its center wavelength of 808 nm is used as the heating source 210; but it is not limited thereto, the laser may have its center wavelength in the range from 800 nm to 1064 nm The first light beam 211 and the second light beam 212 emitted from the heating source 210 may have a cross-section of the same shape and size; for example, a circle cross-section in the embodiment. Also, the first light beam 211 and the second light beam 212 may have the same intensity distribution in the cross-section. The converging unit 220 may include a single lens or a compound lens, which can converge the first light beam 211 and the second light beam 212, so that they have a cross-sectional diameter equal to the line-width of the closed loop 240. In such a case, the first and second light spots 221 and 222 can cover the transverse range of the closed loop 240 exactly.

The substrate 230 can be a cover plate or base plate of flexible material, to be applied to device packaging of the white-light OLED. In the embodiment, the substrate 230 is a color filter (CF) substrate which is a cover plate with a CF layer formed thereon. The frit, which is a mixture of glass and metal powders, can be dispensed on the substrate 230 along the closed loop 240. The frit can be pre-sintered first by means of laser glazing to have a preliminary shape, and then it can be sintered in subsequent laser emissions, so that the curing of the frit and the sealing of the device can be precisely controlled.

In the following context, a single glazing process in sealing a display apparatus according to the embodiment is described in time sequence. At first, by means of the converging unit 220, the first light beam 211 and the second light beam 212 can be focused concurrently on the same specific location on the closed loop 240 to form the first light spot 221 and the second light spot 222, respectively. Taking FIG. 2 as an example, the location at the middle of the front side of the closed loop 240 can be the start of the glazing process, and the location can be referred to the start portion 241. Here, the first light spot 221 and the second light spot 222 may overlap each other partly or completely at the start portion 241. For example, the first and second light spots 221 and 222 overlap at the start portion 241 of the closed loop 240 in an overlapping area more than or equal to 50%.

The first light spot 221 is designed to move left and the second light spot 222 is designed to move right, so that the first and second light spots 221 and 222 are going to scan along the closed loop 240 clockwise or counterclockwise.

Figure 3:
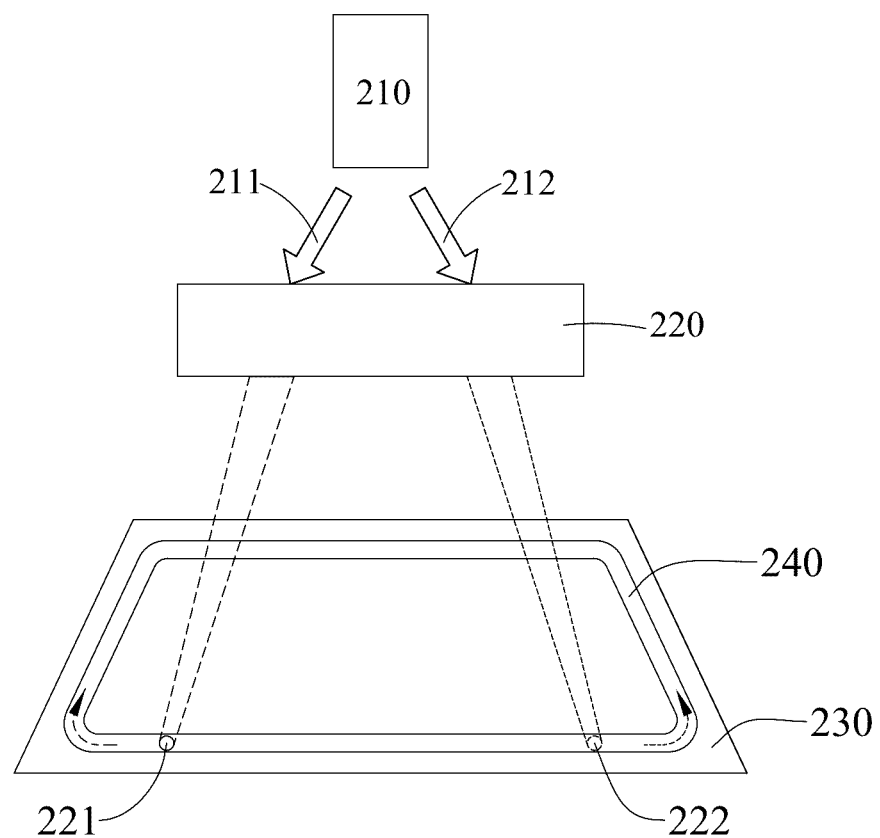
FIG. 3 shows a schematic diagram of a display apparatus to be frit sealed by a glazing module according to one embodiment of the present disclosure (at the midway).

Subsequently, the converging unit 220 drives the first light spot 221 to move along the closed loop 240 clockwise and the second light spot 222 to move along the closed loop 240 counterclockwise to emit the frit on the closed loop 240, as shown in FIG. 3. The clockwise direction can be the first direction and the counterclockwise direction can be the second direction as recited in Claims. In this embodiment, the first light spot 221 and the second light spot 222 move at the same speed to scan the frit on the closed loop 240. But it is not limited thereto, the first light spot 221 and the second light spot 222 may move at different speeds in other embodiments. Basically, the first light spot 221 and the second light spot 222 can be set to have the same shape and size. The first light spot 221 moves left and the second light spot 222 moves right, starting at the start portion 241 where they overlap each other. Since the first light spot 221 and the second light spot 222 separate in the opposite directions, the frit on the start portion 241 can receive optical energy of vertical symmetry and thus can be heated smoothly. As compared with the prior art in which the glazing module provides only a single focused light spot (for example, the first light spot 221), the right movement of the second light spot 222 may compensate the less emission received by the frit on the right part of the start portion 241, if only the first light spot 221 moving left is provided.

In the glazing process, the frit receives optical energy to be heated, and if the temperature exceeds its glazing temperature, the frit can be glazed. However, if the temperature is larger than the peeling temperature but less than the glazing temperature of the frit, a defect like the curve beach 10 shown in FIG. 1 may happen in the frit. To address the above problem, two focused light spots overlapping at the start portion of the glazing process and moving in the opposite directions, as recited in the above embodiments, can be used to smoothen the emission distribution accumulated in the start portion. Thus, all the frit in the start portion can be heated uniformly to a temperature exceeding its glazing temperature.

Figure 4:
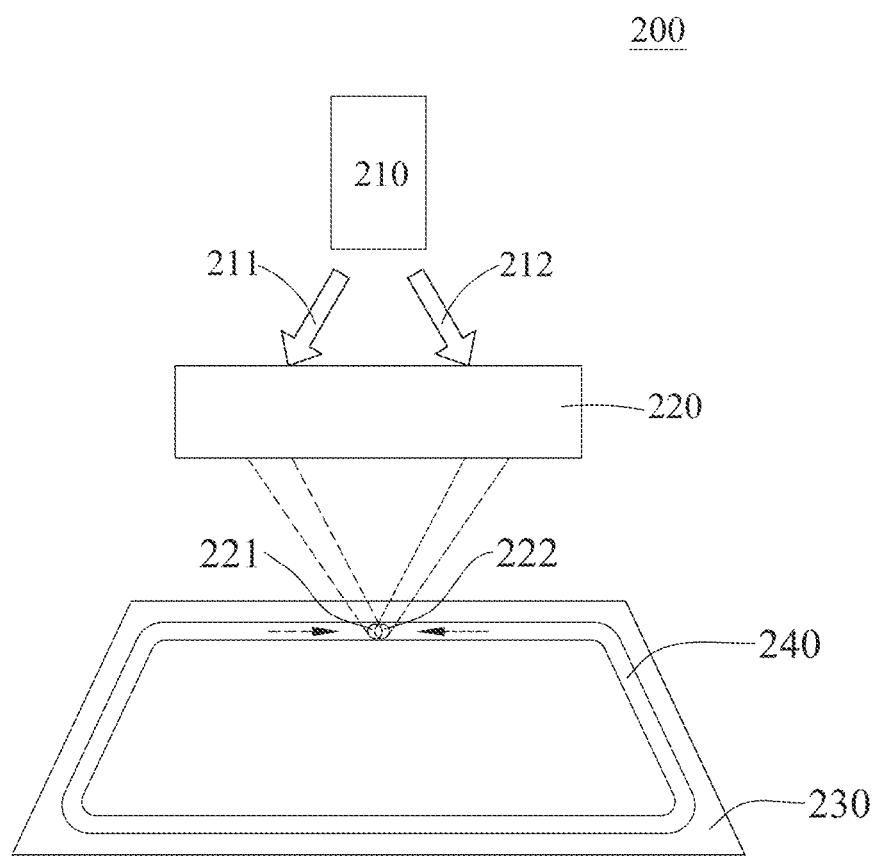
FIG. 4 shows a schematic diagram of a display apparatus to be frit sealed by a glazing module according to one embodiment of the present disclosure (at the end).

The converging unit 220 continues driving the first and second light spots 221 and 222 to move along the closed loop 240 clockwise and counterclockwise, respectively. Finally, the first and second light spots 221 and 222 meet at the middle of the back side of the closed loop 240, as shown in FIG. 4. The single glazing process ends up and the final location can be referred to the end portion 242. Here, the first light spot 221 and the second light spot 222 may overlap each other partly or completely at the end portion 242. For example, the first and second light spots 221 and 222 overlap at the end portion 242 of the closed loop 240 in an overlapping area more than or equal to 50%.

Moreover, the number of light beam is not limited in this disclosure. Two light beams (the first light beam 211 and the second light beam 212) are used in the embodiments, but there can be even number (e.g. 4 and 6) of light beams. Also, if the heating source provides only one light beam, we can also use even number (e.g. 4 and 6) of heating sources in the embodiments.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A method for sealing a display apparatus comprising:
   providing a substrate comprising a displaying region and a non-displaying region;
   disposing a frit on the non-displaying region to form a loop, in which the loop surrounds the displaying region and has both a start portion and an end portion; and
   providing a heating source configured for generating a first light beam and a second light beam;
   applying the first light beam to the frit to glaze it along the loop in a first direction, and applying a second light beam to the frit to glaze it along the loop in a second direction, both of the first light beam and the second light beam starting at the start portion and ending up at the end portion, wherein the second direction is different from the first direction.

2. The method according to claim 1, further comprising:
   providing a converging unit configured for focusing on said first light beam and said second light beam on said frit to form a first light spot and a second light spot, respectively.

3. The method according to claim 2, wherein diameters of the first light spot and the second light spot are larger than or equal to the width of the loop.

4. The method according to claim 1, wherein the first light spot and second light spot overlap at the start portion of the loop in an overlapping area between 50% to 100% of the start portion.

5. The method according to claim 1, wherein the first light beam and second light beam are produced by a glazing module which comprises:
   a heating source, including a laser or a halogen lamp, generating the first light beam and the second light beam; and
   a converging unit configured for focusing the first and second light beams on the frit to form a first light spot and a second light spot, respectively;
   wherein each of the first and second light spots has a diameter larger than or equal to a width of the loop.

6. The display apparatus according to claim 1, wherein the first beam and second light beam are applied to the frit at the same moving speed.

* * * * *